United States Patent

Tabersky et al.

[11] Patent Number: 5,981,078
[45] Date of Patent: Nov. 9, 1999

[54] COMPOSITE BODY AND PROCESS FOR ITS PRODUCTION

[75] Inventors: Ralf Tabersky, Bottrop; Hartmut Westphal, Dermbach, both of Germany; Hendrikus Van Den Berg, Venlo-Blerick, Netherlands; Udo König, Essen; Volkmar Sottke, Mülheim, both of Germany

[73] Assignee: Widia GmbH, Essen, Germany

[21] Appl. No.: 08/983,427

[22] PCT Filed: Jul. 27, 1996

[86] PCT No.: PCT/DE96/01425

§ 371 Date: Dec. 30, 1997

§ 102(e) Date: Dec. 30, 1997

[87] PCT Pub. No.: WO97/07260

PCT Pub. Date: Feb. 27, 1997

[30] Foreign Application Priority Data

Aug. 19, 1995 [DE] Germany ............ 195 30 517
Aug. 19, 1995 [DE] Germany ............ 195 30 518

[51] Int. Cl.[6] ............ B32B 15/04; C23C 16/36; B32P 15/28
[52] U.S. Cl. ............ 428/457; 428/697; 428/698; 427/577; 427/249.19; 427/255.391; 427/255.394; 51/307; 407/119
[58] Field of Search ............ 427/569, 577, 427/255.2, 249, 249.19, 255.391, 255.394; 51/307; 428/457, 697, 698; 407/119

[56] References Cited

U.S. PATENT DOCUMENTS

| | | |
|---|---|---|
| 4,169,913 | 10/1979 | Kobayashi et al. |
| 4,269,899 | 5/1981 | Fuyama et al. |
| 5,325,747 | 7/1994 | Santhanam et al. |

FOREIGN PATENT DOCUMENTS

| | | |
|---|---|---|
| 06 65 308 A1 | 8/1995 | European Pat. Off. |
| 73.04587 | 2/1973 | France |
| 23 06 402 | 9/1973 | Germany |
| 29 17 348 | 4/1979 | Germany |
| 42 39 234 A1 | 6/1994 | Germany |
| 43 13 305 A1 | 10/1994 | Germany |
| 55-120936 | 9/1980 | Japan |
| 61-99 678 | 9/1986 | Japan |
| 62-056564 | 12/1987 | Japan |
| 01-129971 | 5/1989 | Japan |
| 1-36 760 | 5/1989 | Japan |
| 3-64 469 | 6/1991 | Japan |
| 05-306461 | 11/1993 | Japan |
| 06-017228 | 1/1994 | Japan |

*Primary Examiner*—Roy V. King
*Attorney, Agent, or Firm*—Herbert Dubno

[57] ABSTRACT

A composite body for use, for example as a cutting tool, having a metal-carbonitride layer of titanium, zirconium or hafnium carbonitride with at least two of these metals in the lattice structure as deposited by a CVD or plasma-activated-CVD process.

13 Claims, 1 Drawing Sheet

COMPOSITE BODY AND PROCESS FOR ITS PRODUCTION

CROSS REFERENCE TO RELATED APPLICATIONS

This application is a national stage of PCT/DE 96/01425 filed Jul. 27, 1996 and based, in turn, on German national applications 195 30 517.5 and 195 30 518.3 filed Aug. 19, 1995 under the international convention.

FIELD OF THE INVENTION

The invention relates to a composite body, consisting of a hard metal (cemented carbide alloy), cermet, steel or ceramic substrate body and at least one hard metal-carbonitride layer.

The invention relates further to a process for the production of multicomponent, particularly quaternary hard layers with at least two metals from the Ti, Zr, Hf, V, Nb, Ta, Cr, Mo and W group.

BACKGROUND OF THE INVENTION

Substrate bodies coated with hard materials are known in the art. Due to the applied coating of hard materials, optionally applied in several layers, a wear resistant surface can be combined with a tough substrate, capable to sustain high mechanical loads. Basically two processes are used for applying the hard material layer, the Chemical Vapor Deposition (CVD) or the Physical Vapor Deposition (PVD). Such coatings are known easpecially in the field of cutting tools for machining workpieces, where they have the purpose of extending the life of the cutting tool. Usual protective coatings consist for instance of TiC, TiN and/or aluminum oxide. Also multilayer coatings with the layer sequence TiN, Ti(C,N), TiN on a substrate with any desired C:N mixing proportions have been proposed.

For producing wear-resistant layers for machining tools made of rapid machining steel primarily PVD processes are used, while for tools made of hard metals (cemented carbide alloy) CVD processes are preferred. Both processes have advantages and disadvantages. While PVD coatings can be produced starting at approximately 400° C., for the CVD processes far higher temperatures are required, which as a rule lie at about 1000° C. Consequently temperature-sensitive substrates are coated by means of the PVD process, however with this mode of coating it is difficult and costly to achieve a uniform surrounding coating of bodies having a complicated shape.

In "Surface and Coating Technology", 33, (1987) Pages 91 to 103, the properties of ternary nitrides and carbonitrides of the metals titanium, zirconium, hafnium, vanadium, niobium, chrome and aluminum, produced through cathodic sputtering, are tested. In the case of coatings of (Zr,Ti)(C,N), (Zr,Ti)(C,N), (Nb,Ti)(C,N) as well as (Hf,Ti)C and (Hf,Ti)C higher microhardnesses could be reached.

Furthermore from the DE-A1-25 05 009 a process is known for coating inorganic substrates with carbides, nitrides and/or carbonitrides of iron, boron, silicon or the transition metals of the group IVa to VIa of the periodic system of elements through direct thermal reaction of the metals or their derivatives with substances delivering carbon or nitrogen, optionally in the presence of further additives, wherein as carbon and nitrogen donors, among others compounds containing the cyanogen-group with a triple bond between the carbon and the nitrogen should be used. As one of those compounds acetonitrile is mentioned. The coating should be done through the CVD process. The described compounds are exclusively monometallic carbides, nitrides or carbonitrides. It has been found during testing of a process following the teaching contained in this patent that the Zr(C,N) cannot be produced with this process. In all cases the deposition rates per time unit are very low.

More recently the CVD process activated by a corona-discharge plasma (PCVD) has gained importance. With this process it was possible to deposit adherent hard material layers onto tools starting already from approximately 450° C., similarly to the PVD process. Such a process is described for instance in DE 38 41 731 for the deposition of carbides, nitrides or carbonitrides of titanium or zirconium. The individual deposition layers consist of titanium or zirconium nitride, carbide or carbonitride.

OBJECT OF THE INVENTION

It is the object of the present invention to provide a composite body of the kind described in the introduction, whose coating presents a surface layer which is as smooth as possible, particularly for the production of preformed sintered tools, whose outer contours should remain as much as possible unchanged by the coating.

Further it is the object of the present invention to create a process by which multicomponent layers of hard materials with at least two metals of the Groups IVa to VIa can be produced as carbonitride layers. The target is a high layer growth, in order to correspondingly reduce the coating time to a minimum. The produced layers should have properties while surpass considerably the properties of the simple binary compounds, such as carbides and nitrides of titanium or zirconium.

SUMMARY OF THE INVENTION

The novel compound body consists of a hard (cemented carbide alloy), cermet, steel or ceramic substrate body and of at least one oxygen-free hard metal-carbonitride layer, whereby the metal consists of two or more elements of the IVa to IVa Groups. The oxygen-free hard metal-carbonitride layer is deposited by a CVD process or by a plasma-activated CVD process, by forming a single-phase layer with a uniform structure and lattice constant. Preferably the metal-carbonitride layer is a quaternary layer of the general formula $(M_1,M_2)(C,N)$, whereby $M_1$ and $M_2$ are different metals of the mentioned Group IVa to Group VIa, preferably of the IVa and/or Va Groups.

According to a feature of the invention, the deposited layer has the composition $(Ti_xZr_{1-x})(C_yN_{1-y})$ with $0.4<x<0.95$ and $0.2<y<0.9$ with a cubic surface-centered lattice structure, whose lattice constant lies within the range of 0.430 and 0.455 or the composition $(Ti_xHf_{1-x})(C_yN_{1-y})$ with $0.4<x<0.95$ and $0.2<y<0.9$ with a cubic surface-centered lattice structure, whose lattice constant lies within the range of 0.430 and 0.450.

Hard material layers of the material system Ti—Zr—C—N have characteristic values which considerably exceed the properties of the simple binary compounds TiC, ZrC, TiN and ZrN. As already mentioned in the publication previously cited "Surface and Coating Technology", 33, (1987), Pages 91 to 103, the ternary mixed carbides (Ti,Zr)C have already higher hardness values than the binary carbides TiC and ZrC (see also the DE-Zeitschrift Metall, 35th Year, No. 10, October 1981, Pages 999 to 1004, H. Holleck, "Ternäre Carbidsysteme der hochschmelzenden Übergangsmetalle").

Mixed carbides of the type (Ti,Zr)C consist of a unitary phase and have the same cubic crystal structure as their binary components. The titanium and the zirconium distribute themselves in a statistical manner on the places of sublattice of the metal atoms.

The situation is similar with the mixed nitrides of the type (Ti,Zr)N, whereby particularly hard layers are obtained at a ratio of Ti to Zr atoms of about 70:30 atomic %.

Even higher degrees of hardness have been found when the metalloid nitrogen is at the same time also partially substituted by carbon, whereby also single-phase hard materials of the type (Ti,Zr)(C,N) are found, whose metal atoms are statistically distributed on one sublattice and whose metalloids C and N are also distributed without specific order on the other sublattice. Analogous observations could be made in the material system Ti—HF—C—N, wherein the zirconium was substituted by the element hafnium. Here also hardness values have been found which exceed considerably the values of the binary carbides and nitrides. However these mentioned layers of hard material could be applied only through the PVD process as thin layers and at a high cost. Surprisingly it has been found that a deposition of the multicomponent hard layer is also possible by means of the CVD processor or of a plasma-activated CVD process (PCVD) and that the deposited multicomponent layer has a particularly low surface roughness. Particularly composite bodies should be addressed which have a hard metal substrate body, onto which one or more layers are supposed to be applied by CVD or PCVD, at least one of them being a hard multimetal-carbonitride layer. In contrast to high speed steel, hard metals (cemented carbide alloy) can be exposed to high temperatures without damage to the existing structure.

BRIEF DESCRIPTION OF THE DRAWING

The above and other objects, features, and advantages will become more readily apparent from the following description, reference being made to the accompanying drawing in which.

SPECIFIC DESCRIPTION AND EXAMPLES

Figure 1:
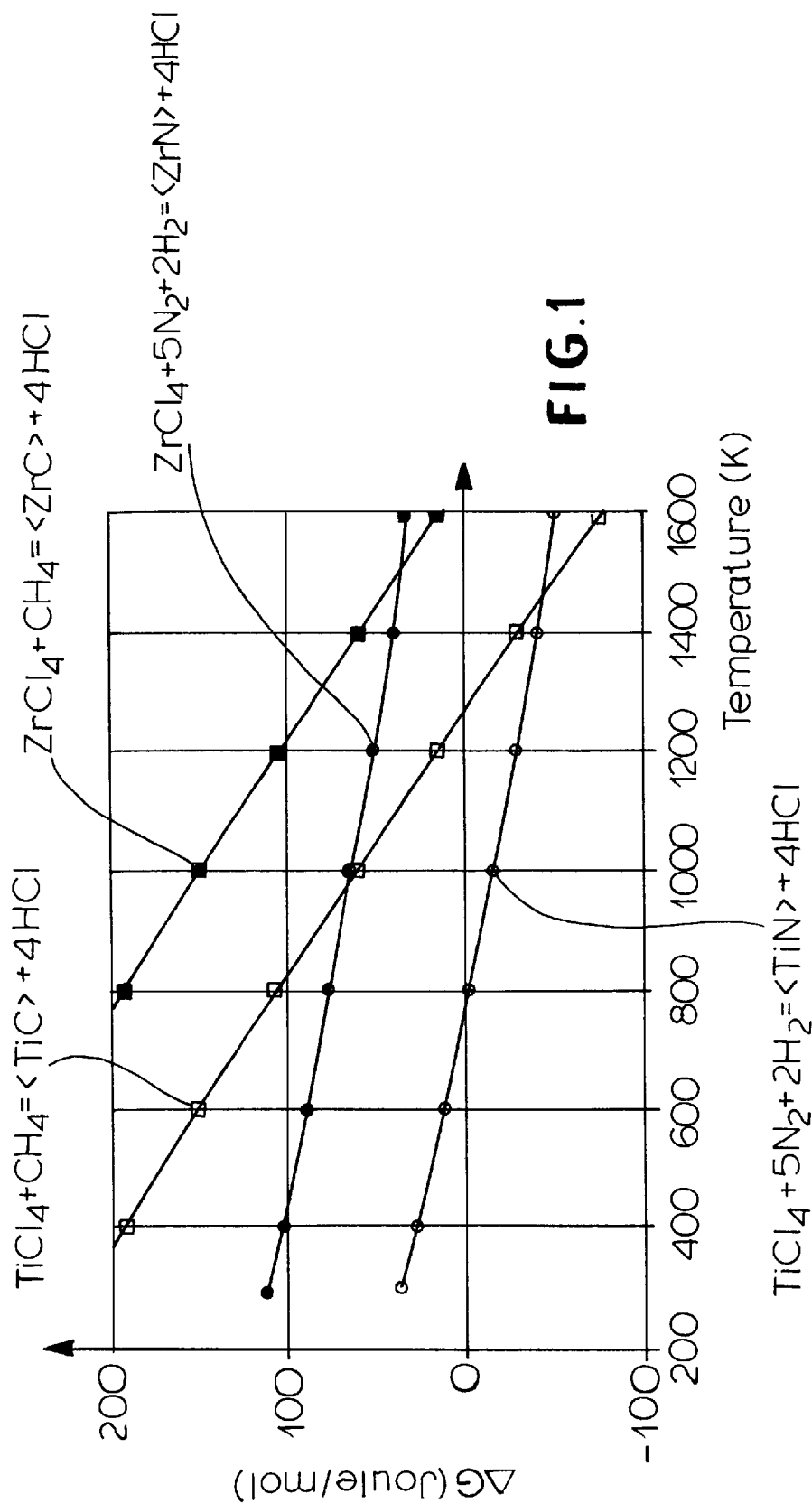
FIG. 1 is a graph illustrating the invention.

The CVD process has been described in principle in the literature. In order to produce for instance a layer of TiC, according to the state of the art it is known to direct a gas mixture of $TiCl_4$, $CH_4$, and $H_2$ (as transport gas) at approximately 1000° C. over the substrate to be coated. The same applies to the production of TiN layers, where instead of the $CH_4$, $N_2$ is used. If $CH_4$ and $N_2$ are introduced simultaneously into the gas phase, then Ti (C,N) is formed. However all carbide, nitride and carbonitride layers described in the literature are compounds with only one metal. This can be explained in that the simultaneous introduction of $TiCl_4$, $ZrCl_4$, $CH_4$, $N_2$ and $H_2$ into the gas phase of the reaction chamber does not lead to the formation of the desired quaternary compounds (Ti,Zr)(C,N). This can be explained by the fact that the chemical equilibrium of the reaction is determined through the energy balance $\Delta G$ which is known as the free reaction enthalpy (or free energy). FIG. 1 shows $\Delta G$ as a function of the temperature for CVD reactions, wherein the solid materials TiC, TiN, ZrC and ZrN are formed. The chemical equilibrium of the reactions lies the farther to the right side the lower the respective $\Delta G$ values are. At temperatures of 1300 K these values are much lower in the reactions of TiC and TiN than in the reactions of ZrC and ZrN. When the gas mixture containing titanium tetrachloride as well as zirconium tetrachloride is introduced in the reaction chamber, forcibly TiC and TiN layers are created, as well as Ti(C,N) through the reaction of solids, but no carbides or nitrides of zirconium or titanium-zirconium carbonitride. As has been surprisingly found, especially quaternary carbonitride layers can still be produced by CVD, when special requirements are met.

A description of the PCVD process is found in DE 38 41 731 C1. At a coating temperature between 400° C. and 750° C., the substrate is connected as cathode and a pulsed direct current is applied thereto. In the pauses between the strong current pulses with voltages between 200 and 900 V and a pulse duration between 20 $\mu$s and 20 ms, a residual voltage is maintained, which should be slightly higher than the ionization potentials of the process gases (preferably about 15 to 20 eV). In the reaction chamber a corona-discharge plasma is created, which consists of charged atoms, molecules and molecule fragments.

The present invention comprises a composite body with several layers of carbides, nitrides and/or carbonitrides of Ti, Cr, Hf, particularly TiC, Ti(C,N), TiN and or $Al_2O_3$ and at least one multimetal-carbonitride layer. Preferably the composite bodies of the invention are used as tools, especially cutting tools for machining operations.

According to the invention, the hard multicomponent layers are applied by CVD, whereby at a reaction temperature between 700° C. and 1100° C. and preferably at pressures between 5 kPa and 100 kPa, besides $H_2$ and/or Ar (as a transport gas) and metal chlorides, the gas phase also contains carbon and nitrogen donors, which have a C—N-molecular group. This C—N-molecular group is preferably a cyanide group with a triple bond between the carbon and the nitrogen, whose distance at room temperature ranges between 0.114 and 0.118 nm. Acetonitrile lends itself as such a carbon and nitrogen donor. However the gas mixture can also contain CN-molecular groups with a simple C—N bond.

In the reactive gas mixture, from which the carbonitride hard material is precipitated, any desired compounds containing a cyanide group can be introduced. Compounds of this kind are in principle known to the state of the art and are described for instance in DE-A1-25 05 009. Also other gaseous media can be gated into the reaction chamber, which are capable to form the respective cyanogen groups —CN at reaction temperatures. Contrary to the prejudice existing in the state of the art, by observing these process instructions it is possible in the case of simultaneous introduction of two or more metal chlorides, to bring to the deposition reaction during layer formation only the one which has the more favorable thermochemical data, it is also possible to introduce both metals into the hard material layer under formation of corresponding single-phase carbonitrides. Surprisingly with the simultaneous presence of for instance $ZrCl_4$ and $TiCl_4$ deposition rates resulted which are many times higher than the ones obtained in the presence of only one metal chloride in the gas phase during CVD. The process according to the invention is advantageously used for the deposition of a hard. material layer (Ti,Zr)(C,N). But it can be applied just as successfully to the quaternary system (Ti,Hf)(C,N).

Correspondingly, instead of the zirconium tetrachloride, hafnium tetrachloride can be gated into the gas phase. It is also possible to use other chlorides of the elements vanadium, niobium, tantalum and chromium. Particularly suitable materials, which at reaction temperatures can release cyanogen radicals —CN are organic compounds such a hydrogen cyanide HCN, cyanamide $H_2N$—CN, cyanogen NC—CN, cyanoazethylene HC—C—CN and the already mentioned acetonitrile $CH_3$—CN. The bond length of the —CN-groups ranges between 0.114 and 0.118 nm.

It is also possible to produce quaternary hard layers of the kind (Ti,Zr)(C,N) with materials whose molecules have simple C—N—bonds. Here belong compounds such as methylamine $H_3C$—$NH_2$ and ethylene diamine $NH_2$—$CH_2$—$CH_2$—$NH_2$. However in such gas mixtures the available zirconium tetrachloride is not totally reacted.

The PCVD process can also be used. Tests have shown that it is not sufficient to use the plasma-activated CVD process known from DE 38 41 731 C1 in such manner that a gas mixture of titanium and zirconium chloride, methane nitrogen, hydrogen and argon was introduced into the reaction chamber and the required reaction temperature was established. Although titanium tetrachloride and zirconium tetrachloride were present in equal amounts, only a Ti(C, N)-layer was formed and only a small amount of zirconium (<1%) could be found.

Surprisingly quaternary hard layers (Ti,Zr)(C,N) can be deposited when the above-mentioned mixture, besides the two metal chlorides, hydrogen and argon, contains also additional gaseous substances which at the reaction temperature could form cyanide fragments or cyanide radicals CN with triple bonds between the carbon and the nitrogen.

The present invention overcomes one of the generally accepted prejudices regarding CVD techniques, that with the simultaneous introduction of two or more metal chlorides, only the one with the more favorable thermochemical data participates in the reaction during layer formation. The process of the invention can be used particularly for the deposition of quaternary systems of the type Ti—Zr—C—N and Ti—Hf—C—N, or in the case of such multicomponent carbonitride hard materials which contain various combinations of elements of the Group IVa or the Group Va of the periodic system.

Preferably the ionized and the nonionized C—N-donors are produced as molecule or ion fragments by ionization and/or by thermal dissociation of gases with cyanide groups by means of plasma activation at. temperatures between 400° C. and 700° C. Acetonitrile was added to the reaction mixture as a preferred donor of carbon and nitrogen. The gas mixture can also contain carbon and nitrogen donors with CN-groups with a single bond existing between the carbon and the nitrogen. Thereby for instance the following substances result, which at reaction temperature could release the proper cyanide groups or radicals: hydrogen cyanide HCN, cyanamide $H_2N$—CN, cyanogen NC—CN, cyanoacethylene HC—C—CN and acetonitrile $CH_3$—CN. The bond length of the CN-radicals should range respectively between 0.114 nm and 0.118 nm. Single CN-bonds in the radicals are obtained when compounds such as methylamine $H_3C$—$NH_2$ and ethylenediamine ($NH_2$—$CH_2$—$CH_2$—$NH_2$) are added to the gas mixture. However the zirconium chloride was not completely reacted only by adding these substances, so that the gas mixture should preferably contain at least partially CN-fragments with triple bonds.

In the following embodiment examples of the invention are described, also in comparison to the depositions known to the state of the art.

For the tests 1 to 5 a CVD apparatus was provided with a reaction vessel made of a heat-resistant steel alloy, wherein approximately 600 indexable inserts (measurements 12.4× 12.4×4 mm), can be coated at the same time. The temperature can be set to values up to 1000° C. and the inner pressure between 500 and 100 kPa. By means of a gas mixing device, precisely metered mixtures of various gases can be introduced into the reaction vessel. The main component of the introduced gases is hydrogen. Gaseous titanium tetrachloride is obtained through vaporization from liquid titanium tetrachloride. Gaseous zirconium tetrachloride is obtained by directing HCl-gas over chips of metallic zirconium. The heating of the samples up to a coating temperature takes place in an inert gas atmosphere, for instance argon. The cooling following the coating is performed in a hydrogen atmosphere.

Test 1 (State of the Art):

At a temperature of 1010° C. and a pressure of 30 kPa, a gas mixture of 1.5% $TiCl_4$, 1.2.% $ZrCl_4$, 3% $CH_4$, 15% $N_2$, the balance being $H_2$, was introduced into the reaction vessel for a duration of 180 minutes. After cooling, the samples were removed and analyzed. The layers deposited on the hard metal substrates arranged in the reaction vessel had a thickness between 7 and 10 μm, depending on their position in the reactor. After x-ray diffraction testing and electron-beam microprobe analysis, it could be established that the deposited layers consisted of Ti(C,N). The zirconium content in these layers was lower than 1%, while in the cold exhaust gas pipes solid deposits of zirconium chloride could be found. The production of quaternary carbonitrides is not possible this way. The hardness of the deposited titanium carbonitride layer was determined with a microhardness testing device and equaled 2350 HV05 (Vickers Hardness at 50 g load).

Test 2

The difference with respect to Test 1 is that here gaseous acetonitrile $CH_3$—CN in an amount of 3.5% was introduced instead of $CH_4$ and $N_2$. The pressure was 8 kPa. After three hours of coating, grey metallic layers with a thickness between 9 and 12 μm have been formed on the substrates. Through x-ray imaging it was determined that the deposited layer material consists of a unitary cubic surface-centered phase with a lattice constant of 0.4365 nm. It has been found through electron-beam microanalysis that the layers have a composition of the formula $(Ti_{0.64}Zr_{0.36})(C_{0.62}N_{0.38})$. The layers also contain unavoidable contaminations of oxygen (below 0.3%) and cobalt (0.6% close to the border surface between the hard metal substrate and the applied layer). But the difference in relation to the first test was that in the exhaust gas there were no zirconium chloride deposits, so that it can be assumed that an almost complete reaction of the $ZrCl_4$ took place. The microhardness measured at various indexable inserts ranged between 2800 and 3400 HV05, i.e. considerably above the microhardness of the Ti(C,N) layers produced according to the state of the art. The quaternary layer produced by CVID had a high quality surface, i.e. a relatively smooth surface with little surface roughness.

Test 3

Instead of the zirconium chloride $ZrCl_4$ used in Test 2, hafnium chloride $HfCl_4$ was introduced in the same amount. On the hard metal substrates, hard material layers with a thickness between 9 and 13 μm were formed, which also consisted of a unitary, cubic surface-centered phase with a lattice constant of 0.4401 nm. The analysis showed a composition of the formula $(Ti_{0.67}Hf_{0.33})(C_{0.58}N_{0.42})$. A microhardness between 2920 and 3550 HV05 was measured.

Test 4

Corresponding to the conditions described in Test 2, instead of acetonitrile a gas with a single C—N bond was used, namely methylamine. The produced quaternary hard material layers had a cubic surface-centered structure. However the composition corresponding to the formula $(Ti_{0.86}Zr_{0.14})(C_{0.72}N_{0.18})$ had a lower zirconium content than the layer obtained in Test 2, although identical initial amounts of $ZrCl_4$ had been used.

Test 5

On indexable inserts at first an approximately 1 µm thick layer of titanium nitride was deposited from a gas mixture of 1.5% $TiCl_4$, 25% $N_2$, the balance being $H_2$. On that an 8 µm thick layer of a hard material (Ti,Zr)(C,N) was deposited according to the specification in Test 2. The last finishing layer was deposited from a gas mixture of 2% $AlCl_3$, 5% $CO_2$ and 93% $H_2$ gas phase, each having a thickness between 1 and 5 µm. Consequently the layer sequence is TiN—(Ti,Zr)(C,N)—$Al_2O_3$; the substrate body was a hard metal (WC—Co). The indexable inserts produced this way were used for comparative wear resistance tests.

The indexable inserts obtained in the various coating tests were tested on a lathe. Thereby an abrasive steel casting with a hardness of 320 HB was machined. The indexable inserts had the designation CNMG 120412. During the tests the lathe worked with the following setting:
Cutting speed 100 m/min,
Cutting depth 1.5 mm
Advance 0.28 mm/rotation.

For these comparative tests indexable inserts with an almost similar layer thickness of 10 µm were selected. The tool life up to wear mark width of 0.3 mm was determined. The results are shown as follows:

| Test | Coating | Tool life (min) |
| --- | --- | --- |
| 1 | Ti (C,N) | 18 |
| 2 | $(Ti_{0.64}Zr_{0.36})(C_{0.62}N_{0.38})$ | 34 |
| 3 | $(Ti_{0.67}Hf_{0.33})(C_{0.58}N_{0.42})$ | 32 |
| 4 | $(Ti_{0.76}Zr_{0.24})(C_{0.72}N_{0.18})$ | 28 |

The above Table shows that the coating according to the invention corresponding to Tests 2 to 4 shows a considerably improved tool life.

In a further test a series of indexable inserts was produced, which had a hard metal substrate body and a multilayer coating. The multilayer coating had the layer sequence described in Test 5, the test specimens were indexable insert of the geometry CNMG 120412. The respective tests, conducted under the same conditions as previously described, showed the following results:

| Coating | Tool life (min) |
| --- | --- |
| TiN + Ti (C,N) + $Al_2O_3$ (State of the Art) | 42 |
| TiN + $(Ti_{0.64}Zr_{0.36})C_{0.62}N_{0.38})$ + $Al_2O_3$ (according to the invention. | 51 |

Consequently also in the case of indexable inserts with multilayer coatings, one of the layers being a multicomponent layer—in this case (Ti,Zr)(C,N)—much improved wear characteristics are obtained in chip-removing tools.

For the Tests 6 to 11 the plasma CVD process described in DE 38 41 731 C1 was used, the process technology described therein is also used in the case of the present invention. At a coating temperature between 400° C. and 750° C., the substrate is connected as a cathode and a pulsed direct current is applied to it. In the pauses between the strong current pulses with voltages between 200 and 900 V and a pulse duration between 20 µs and 20 ms, a residual voltage is maintained which should be slightly higher than the ionization potentials of the process gases (preferably approximately 15 to 20 eV). In the reaction chamber a corona-discharge plasma is created, which consists of charged atoms, molecules and molecule fragments. In the performed test approximately 400 indexable inserts (size 12.4×12.4×4 mm) are simultaneously arranged and coated in a reaction vessel. The temperature is set at between 200° C. and 750° C. by means of an external heating system. During coating the inner pressure ranges between 50 and 5000 Pa. The gas mixing device makes possible the introduction of mixtures of various gases in precise dosages. Hydrogen and argon are introduced as main components of the supplied gases. Gaseous titanium tetrachloride is obtained through vaporization of liquid titanium tetrachloride. Gaseous zirconium is obtained by passing of HCl gas over chips of metallic zirconium. The heating of the specimens up to the coating temperature takes places in an inert gas, such as argon.

Test 6 (State of the Art)

At a temperature of 550° C. and a pressure of 80 Pa, a gas mixture of 1.8% $TiCl_4$, 1.8% $ZrCl_4$, 5% $CH_4$, 20% $N_2$, 40% $H_2$ and 31.4% Ar are introduced into the reaction vessel for a period of 120 minutes. After cooling, the specimens are removed and analyzed. The thickness of the layers deposited on the hard metal substrate range between 3.8 and 4.6 µm. Through x-ray diffraction testing and electron-beam microprobe analysis, it was established that these were layers of Ti(N,C). The zirconium content of the layer is lower than 1%. On the other hand solid deposits of $ZrCl_4$ were found in the cold gas exhaust pipes. Through microhardness testing it was determined that the hardness value of the produced layers is approximately 2400 HV05 (Vickers hardness at: 50 g load).

Test 7

The difference with respect to test 6 is that here instead of $CH_4$ and $N_2$, gaseous acetonitrile $CH_3$—CN in an amount of 3.5% is introduced into the reaction chamber. The percentages of metal chlorides correspond to those of Test 6, the proportion of the carrier gases hydrogen and argon were increased to the same extent each by 21.25% with respect to the percentages indicated in Test 6. The pressure equals 300 Pa. After a two-hour coating, gray metallic layers with a thickness between 4 to 4.4 µm with a unitary cubic surface-centered phase and having a lattice constant 0.4450 nm were formed on the substrate, which can be determined by x-ray diffraction testing. An electron-beam microanalysis shows that the layers have a composition according to the formula $(Ti_{0.62}Zr_{0.38})(CO_{0.60}N_{0.40})$. In contrast to Test 6, there are no deposits of zirconium chloride in the gas exhaust pipe, which leads to the conclusion of practically complete reaction of the supplied zirconium tetrachloride. The microhardness values measured at different indexable inserts range between 3200 and 3500 HV05.

Test 8

Instead of the zirconium tetrachloride $ZrCl_4$ used in Test 7, the same amount of $HfCl_4$ is supplied. Under identical conditions, hard layers with a thickness of 3.6 to 4.2 µm are obtained, which also consist of a unitary cubic surface-centered phase with a lattice constant of 0.4396 nm. An analysis shows a composition according to the formula $(Ti_{0.65}Hf_{0.35})(C_{0.56}N_{0.44})$. The microhardness of the produced coating ranges between 3250 and 3650 HV05.

Test 9

Corresponding to the conditions described in Test 7, instead of acetonitrile methylamine is supplied, which has a single bond between carbon and nitrogen. Here too quaternary hard layers with a cubic surface-centered structure can be obtained, with a composition corresponding to the formula $(Ti_{0.84}Zr_{0.16})(C_{0.70}N_{0.29})$. However in comparison to test 7, the results show a lower zirconium content, although the initial amounts of $TiCl_4$ and $ZrCl_4$ were the same.

Test 10

At first an approximately 0.5 μm thick layer of TiN is deposited on indexable inserts from a gas mixture consisting of 2% $TiCl_4$, 20% $N_2$, 40% $H_2$, the balance being argon. On that a 5 μm thick layer of TiN of the hard material (Ti,Zr)(C,N) is deposited according to Test 7. As a further layer a 0.5 μm thick layer of TiN is applied, so that a multilayer coating of three individual layers with a total thickness of 6 μm results. The indexable inserts coated this way are subjected to comparative wear resistance testing.

The various inclexable inserts of the type SEKN 1203 AFTN obtained in different tests are tested on a milling machine. As the material to be machined 60 mm wide and 600 mm long blocks of a tempering steel 42CrMo4V (1100 n/mm2) are machined by face cutters. The test are performed with the following settings of the milling machine:

Cutting speed 220 m/min, cutting depth 5 mm, advance 0.25 mm/tooth.

For the comparison tests indexable inserts with almost identical layer thickness (approximately 5 to 6 μm) are selected. In the wear resistance test, cutting edge after cutting edge is milled for so long, until the width of the wear marks at the main cutting edge reaches more than 0.5 mm. The subsequently shown obtained milling length are a criterium for the efficiency of the respective indexable inserts:

| Test | Coating | Milling length (m) |
|---|---|---|
| 1 | Ti (C,N) | 10.8 |
| 2 | $(Ti_{0.62}Zr_{0.38})$ $(C_{0.60}N_{0.40})$ | 14.4 |
| 3 | $(Ti_{0.65}Hf_{0.35})$ $(C_{0.56}N_{0.44})$ | 15.6 |
| 4 | $(Ti_{0.84}Zr_{0.16})$ $(C_{0.70}N_{0.29})$ | 12.0 |

The above Table shows that the coatings of the invention according to Tests 7 to 9 have a considerably improved wear resistance.

Test 11

It is known that useful life of indexable inserts (due to multiple factors influencing the wear process at the cutting edge) is increased through the application of multiple layer coatings. Differently than in Test 10, here indexable inserts with multilayer coatings are produced, wherein one of the layers is a multicomponent carbonitride layer. In the present test, with the same geometry of the indexable inserts and the same total layer thickness, the coatings indicated in the following Table, with a layer sequence of TiN—Ti(C,N) and TiN are selected. The results can be seen from the following Table:

| Coating | Milling length (m) |
|---|---|
| TiN + Ti (C,N) + TiN (State of the Art) | 13.8 |
| TiN + $(Ti_{0.62}Zr_{0.38})$ $(C_{0.60}N_{0.40})$ + TiN (according to the invention) | 18.6 |

Also in indexable inserts with multilayer coatings, the indexable inserts whose middle layer consisted of a titanium-zirconium-carbonitride layer, had an improved wear resistance.

We claim:

1. A composite body consisting of a hard metal, cermet, steel or ceramic substrate body and at least one hard metal-carbonitride layer on said substrate body, the metal-carbonitride layer having a metal component consisting of at least two elements selected from the group consisting of Ti, Zr and Hf and the metal-carbonitride layer being deposited through a CVD process or a plasma activated CVD process in the form of a single-phase layer, the deposited layer having the composition $Ti_xZr_{1-x})(C_yN_{1-y})$ with $0.4<x<0.95$ and $0.2<y<0.9$ with a cubic surface-centered lattice structure, whose lattice constant lies within the range of 0.430 and 0.455 or the composition $Ti_xHf_{1-x})(C_yN_{1-y})$ with $0.4<x<0.95$ and $0.2<v<0.9$ with a cubic surface-centered lattice structure, whose lattice constant lies within the range of 0.430 and 0.450.

2. The composite body according to claim 1, wherein the substrate body is coated with several layers of carbides, nitrides and/or carbonitrides of Ti, Zr, Hf or $Al_2O_3$ and at least one multimetal carbonitride layer.

3. The composite body according to claim 1, in the form of a cutting tool for machining processes.

4. A process for the production of a composite body consisting of a hard metal, cermet, steel or ceramic substrate body and at least one hard metal-carbonitride layer on said substrate body the metal-carbonitride layer having a metal component consisting of at least two elements selected from the group consisting of Ti, Zr and Hf and the metal-carbonitride layer being deposited through a CVD process or a plasma activated CVD process in the form of a single-phase layer, the deposited layer having the composition $(Ti_xZr_{1-x})(C_yN_{1-y})$ with $0.4<x<0.95$ and $0.2<y<0.9$ with a cubic surface-centered lattice structure, whose lattice constant lies within the range of 0.430 and 0.455 or the composition $(Ti_xHf_{1-x})(C_yN_{1-y})$ with $0.4<x<0.95$ and $0.2<y<0.9$ with a cubic surface-centered lattice structure, whose lattice constant lies within the range of 0.430 and 0.450, wherein the hard layer is applied by CVD, at a reaction temperature between 700° C. and 1100° C. and at pressures between 5 kPa and 100 kPa, from a gas phase which contains, besides $H_2$ and/or argon as well as chlorides of different metals, also carbon and nitrogen donors which have a C—N-molecular group.

5. The process according to claim 4 wherein the C—N-molecular group contains a cyanide group-CN with a triple bond between the carbon and the nitrogen, whose distance at room temperatures ranges between 0.114 and 0.118 nm, by using acetonitrile.

6. The process according to claim 4 wherein the CN-molecular group contains molecular groups with a single bond between the carbon and the nitrogen.

7. The process according to one of claim 4 wherein the hard layer consists of (Ti,Zr)(C,N) or (Ti,Hf)(C,N).

8. A process for the production through a plasma-activated CVD process of quaternary carbonitride hard layers with at least two metals selected from the group consisting of Ti, Zr, Hf, V, Nb, Ta, Cr, Mo and W, on a substrate body of hard metal, cermet, steel or a ceramic, wherein a plasma activated CVD process is carried out in a reactive gas atmosphere at a reaction temperature and wherein the gas atmosphere contains besides hydrogen, argon, two or more different chlorides of said metals, also ionized and/or nonionized carbon-nitrogen donors with triple bonds, whereby the bond distance between the carbon and the nitrogen at room temperature ranges between 0.114 and 0.118 nm.

9. The process according to claim 8 wherein the ionized and the nonionized C—N-donors are produced through dissociation from gases with cyanide groups by means of plasma activation at temperatures between 400° C. and 700° C.

10. The process according to claim 8 wherein the reaction mixture contains acetonitrile as a carbon-nitrogen donor.

11. The process according to claim 8, wherein the carbon-nitrogen donors in the reaction mixture also contains CN-groups with a single bond between the carbon and the nitrogen.

12. Process according to claim 8, wherein at least one hard layer of a multilayer coating consists of (Ti,Zr)(C,N) and/or of (Ti,Hf)(C,N).

13. Process according to claim 8, wherein the plasma activation is performed at the substrate body connected as a cathode with a pulsed direct voltage.

* * * * *